(12) United States Patent  
Takahashi et al.

(10) Patent No.: US 10,855,208 B2  
(45) Date of Patent: Dec. 1, 2020

(54) PIEZOELECTRIC POWER GENERATION DEVICE

(71) Applicant: Murata Manufacturing Co., Ltd., Nagaokakyo (JP)

(72) Inventors: Kohei Takahashi, Nagaokakyo (JP); Tsuguji Kanbayashi, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 628 days.

(21) Appl. No.: 15/723,501

(22) Filed: Oct. 3, 2017

(65) Prior Publication Data

US 2018/0041142 A1   Feb. 8, 2018

Related U.S. Application Data

(63) Continuation of application No. PCT/JP2016/058774, filed on Mar. 18, 2016.

(30) Foreign Application Priority Data

Apr. 13, 2015   (JP) .................................. 2015-081837

(51) Int. Cl.
  *H02N 2/18* (2006.01)
  *H01L 41/113* (2006.01)
  (Continued)

(52) U.S. Cl.
  CPC ........... *H02N 2/18* (2013.01); *H01L 41/0472* (2013.01); *H01L 41/0475* (2013.01);
  (Continued)

(58) Field of Classification Search
  CPC ... H02N 2/18; H01L 41/0472; H01L 41/0475; H01L 41/053; H01L 41/083; H01L 41/113; H01L 41/1138; H01L 41/1876
  See application file for complete search history.

(56) References Cited

U.S. PATENT DOCUMENTS

| 8,400,046 | B2 | 3/2013 | Hayamizu |
| 2010/0308691 | A1 | 12/2010 | Hayamizu |

(Continued)

FOREIGN PATENT DOCUMENTS

| JP | H11-31854 A | 2/1999 |
| JP | 2006-318838 A | 11/2006 |

(Continued)

OTHER PUBLICATIONS

International Search Report issued in International Application No. PCT/JP2016/058774, dated May 31, 2016.

(Continued)

*Primary Examiner* — Bryan P Gordon  
(74) *Attorney, Agent, or Firm* — Arent Fox LLP

(57) ABSTRACT

A piezoelectric power generation device comprises a power generation element which includes a support body having a plate-like planar portion with first and second opposed main surfaces and a projecting portion projecting from a center portion of the second main surface. The first projecting portion has an outer periphery when seen in plan view along a direction perpendicular to the first main surface. A piezoelectric body is provided on the first surface and overlaps the first projecting portion when the first support body is seen in plan view along a direction perpendicular to the first main surface. A plurality of legs extend from the plate like planar portion away from the piezoelectric body. The legs are located radially outward of the periphery of the first projecting portion when the first support body is seen in plan view along a direction perpendicular to the first main surface.

16 Claims, 9 Drawing Sheets

(51) Int. Cl.
*H01L 41/047* (2006.01)
*H01L 41/053* (2006.01)
*H01L 41/083* (2006.01)
*H01L 41/187* (2006.01)
*H01L 41/27* (2013.01)
*H01L 41/293* (2013.01)

(52) U.S. Cl.
CPC .......... *H01L 41/053* (2013.01); *H01L 41/083* (2013.01); *H01L 41/113* (2013.01); *H01L 41/1138* (2013.01); *H01L 41/1876* (2013.01); *H01L 41/27* (2013.01); *H01L 41/293* (2013.01)

(56) References Cited

U.S. PATENT DOCUMENTS

| | | | | |
|---|---|---|---|---|
| 2012/0248937 | A1* | 10/2012 | Hayamizu | H01L 41/1138 310/339 |
| 2013/0207793 | A1* | 8/2013 | Weaber | G06F 1/1626 340/407.2 |
| 2017/0030380 | A1* | 2/2017 | Hayamizu | H02N 2/185 |
| 2017/0126149 | A1* | 5/2017 | Hayamizu | H02N 2/186 |

FOREIGN PATENT DOCUMENTS

| | | |
|---|---|---|
| JP | 2008-311529 A | 12/2008 |
| JP | 2014-33478 A | 2/2014 |
| JP | 2014-238277 A | 12/2014 |
| WO | 2009/063610 A1 | 5/2009 |

OTHER PUBLICATIONS

Written Opinion of the International Searching Authority issued in International Application No. PCT/JP2016/058774, dated May 31, 2016.

* cited by examiner

POSITION OF PIEZOELECTRIC BODY
IN TRANSVERSE DIRECTION

PIEZOELECTRIC POWER GENERATION DEVICE

CROSS REFERENCE TO RELATED APPLICATIONS

The present application is a continuation of International application No. PCT/JP2016/058774, filed Mar. 18, 2016, which claims priority to Japanese Patent Application No. 2015-081837, filed Apr. 13, 2015, the entire contents of each of which are incorporated herein by reference.

TECHNICAL FIELD

The present invention relates to a piezoelectric power generation device.

BACKGROUND OF THE INVENTION

A piezoelectric power generation device is used as a power generation device using a piezoelectric element. Japanese Unexamined Patent Application Publication No. 11-031854 (Patent Document 1) discloses an example of the piezoelectric power generation device. The piezoelectric power generation device includes a plurality of laminated elastic bodies. Each elastic body has a disc-like shape and a recess portion between a doughnut-like outer circumferential portion and a center portion. A piezoelectric element is provided in the recess portion of each elastic body. The elastic bodies are laminated while the above-described doughnut-like outer circumferential portions are made to abut against each other.

A piezoelectric power generation device disclosed in Japanese Unexamined Patent Application Publication No. 2008-311529 (Patent Document 2) includes pressure members provided with pressure elements having convex lens-like shapes at the centers. The pressure members are arranged between a plurality of laminated piezoelectric elements. The respective piezoelectric elements abut against the pressure elements.

In the piezoelectric power generation devices disclosed in Patent Documents 1 and 2, when load is applied for power generation, stress is concentrated in a portion to which the load is applied. Therefore, the piezoelectric elements are easy to break.

In the piezoelectric power generation device disclosed in Patent Document 1, the doughnut-like outer circumferential portions of the respective elastic bodies abut one another. A spring constant thereof is therefore increased. Accordingly, a large load is necessary for deforming the piezoelectric elements and it is difficult to enhance power generation efficiency.

An object of the present invention is to provide a piezoelectric power generation device that has high power generation efficiency and makes a piezoelectric body hard to be broken.

BRIEF DESCRIPTION OF THE INVENTION

In one aspect of the invention, a piezoelectric power generation device comprises first and second power generation elements. The first power generation element includes a first support body having a plate-like planar portion with first and second opposed main surfaces and a first projecting portion projecting from a center portion of the second main surface. The first projecting portion has an outer periphery when seen in plan view along a direction perpendicular to the first main surface. A piezoelectric body is provided on the first surface and overlapping the first projecting portion when the first support body is seen in plan view along a direction perpendicular to the first main surface. The second power generation element includes a second support body having a plate-like planar portion with third and fourth opposed main surfaces and a second projecting portion projecting from a center portion of the fourth main surface. A second piezoelectric body is provided on the third main surface and overlaps the second projecting portion when the second support body is seen in plan view along a direction perpendicular to the third main surface. A plurality of legs extend from at least one of the power generation elements toward the other of the power generation elements and cause the second and third main surfaces to be spaced from and opposed to one another with the second piezoelectric element located there between. The plurality of legs are located radially outward of the periphery of the first projecting portion when the first support body is seen in plan view along a direction perpendicular to the first main surface.

In an aspect of the invention when the first piezoelectric body is pressed in the direction of the second power generation element, the first projection element presses against the second piezoelectric body. The first projecting portion preferably has a center when seen in plan view along a direction perpendicular to the first main surface and a thickness of the first projecting portion is larger at its center than at a peripheral edge portion located radially outward from its center. As one example, the first projecting portion is stepped in shape so that at least a first portion of the first projecting portion is thicker than a second portion of the first projecting portion.

In a preferred embodiment, the planar portion of the first support body has a polygonal shape having vertices and the plurality of legs project from respective ones of the vertices. The planar portion of the second support body preferably has a polygonal shape having vertices and the plurality of legs project from respective ones of the vertices. Alternatively, the first projecting portion can have a circular planar shape as seen in plan view along the direction perpendicular to the first main surface. In some embodiments, each of the plurality of legs are longer than the thickness of the first projecting portion.

In another aspect of the invention, the piezoelectric power generation device includes at least a third power generation element, all of the power generation elements being stacked one on top of the other. In embodiments, all of the power generation elements have the same structure.

In one embodiment the plate-like planar portion of the first support body has first and second opposed peripheral edges and the plurality of legs comprise first and second legs extending along the entirety of the first and second peripheral edges, respectively.

In some embodiments the first power generation element includes a first external connection terminal electrically connected to the first piezoelectric body, the first external connection terminal having an opening in the form of a through hole or a cut out. The second power generation element includes second external connection terminal electrically connected to the second piezoelectric body, the second external connection terminal having an opening in the form of a through hole or cut out. In such embodiments, the piezoelectric power generation device can further include a pin having a central longitudinal axis, the pin having first, second, and third contiguous portions. A width of the first portion as measured perpendicular to the central longitudinal axis is smaller than a width of the second portion as measured perpendicular to the central longitudinal axis. A width of the third portion as measured perpendicular to the central longitudinal axis is smaller than the width of the first portion and is larger than the width of the second portion. The second portion extends through the openings in the first and second external connection terminals. The first power generation element further includes a base member having an opening into which the third portion of the pin extends so as to electrically connect the first and second external connection terminals and physically fasten the pin, the first and second external connection terminals and the base together.

In embodiments the first and second connection terminals are held in a clamped state between the first portion of the pin and the base member and the longitudinal central axis of the pin extends in a direction perpendicular to the first and third main surfaces. In some embodiments a projection is provided on a surface of the pin where the first portion of the pin makes contact with the first external connection terminal. In some embodiments a surface of the first portion of the pin which makes contact with the first external connection terminal is inclined such that a thickness of the first portion as measured parallel to the central longitudinal axis decreases from a radially outer portion of the first portion toward the central longitudinal axis.

The invention is also directed to a piezoelectric power generation device comprising a power generation element which includes a support body having a plate-like planar portion with first and second opposed main surfaces and a projecting portion projecting from a center portion of the second main surface. The projecting portion has an outer periphery when seen in plan view along a direction perpendicular to the first main surface. A piezoelectric body is provided on the first main surface and overlaps the projecting portion when the support body is seen in plan view along a direction perpendicular to the first main surface. A plurality of legs extend from the plate like planar portion away from the piezoelectric body, the plurality of legs are located radially outward of the periphery of the projecting portion when the first support body is seen in plan view along a direction perpendicular to the first main surface. In various embodiments, the leg portions are support points, the piezoelectric body is a force point, and the projecting portion is an action point. When the piezoelectric body is pressed toward the second main surface, the projecting portion acts on an external part.

According to the present invention, the thickness of a support body is different between a center portion and a peripheral edge portion. Therefore, when a center portion of a piezoelectric body is pressed, concentration of stress that is applied to the piezoelectric body can be moderated. Accordingly, a piezoelectric power generation device that makes the piezoelectric body hard to be broken and has high power generation efficiency can be provided.

DESCRIPTION OF EMBODIMENTS

Hereinafter, the present invention will be made clear by describing specific embodiments of the present invention with reference to the drawings. It should be noted that respective embodiments which are described in the specification are exemplary and, inter alia, partial replacement or combination of components between different embodiments can be made.

First Embodiment

Figure 1:
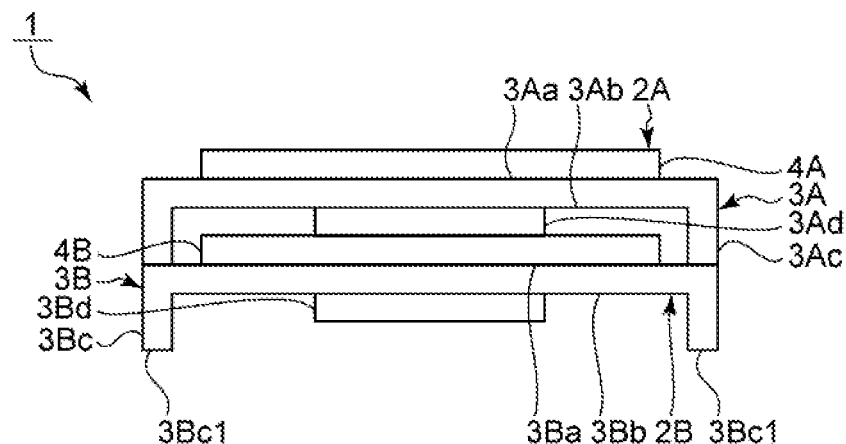
FIG. 1 is a front view of a piezoelectric power generation device according to a first embodiment of the present invention.
Figure 2:
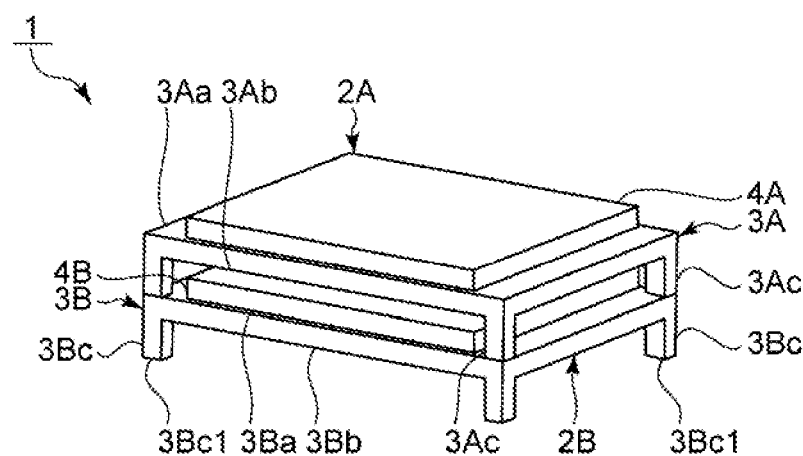
FIG. 2 is a perspective view of the piezoelectric power generation device in the first embodiment of the present invention.

FIG. 1 is a front view of a piezoelectric power generation device according to a first embodiment of the present invention. FIG. 2 is a perspective view of the piezoelectric power generation device in the first embodiment of the present invention.

As illustrated in FIG. 1, a piezoelectric power generation device 1 includes a first power generation element 2A and a second power generation element 2B. In FIG. 1, the first power generation element 2A is provided on the second power generation element 2B.

Figure 3:
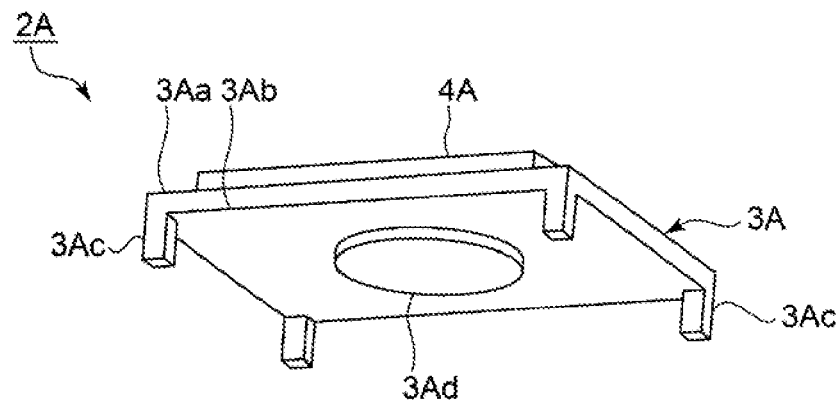
FIG. 3 is a perspective view of a first power generation element in the first embodiment of the present invention.

The first power generation element 2A includes a support body 3A and a piezoelectric body 4A. The support body 3A is made of, for example, a conductive material such as metal or alloy or an insulating material such as a ceramic material. The support body 3A includes a planar portion, a projecting portion 3Ad, and support portions 3Ac as leg portions. The planar portion, the projecting portion 3Ad, and the support portions 3Ac of the support body 3A are integrally formed. The planar portion of the support body 3A has a rectangular plate shape and has an upper surface 3Aa as one main surface and a lower surface 3Ab as the other main surface. The projecting portion 3Ad of the support body 3A is provided on the lower surface 3Ab of the planar portion of the support body 3A. The projecting portion 3Ad of the support body 3A projects from a center portion of the planar portion of the support body 3A. The projecting portion 3Ad preferably has a circular shape when the support body 3A is seen in bottom view along a direction perpendicular to the lower surface 3Ab of the support body 3A with reference to FIG. 3. The center of the support body 3A and the center of the projecting portion 3Ad overlap with each other and are preferably coincident with each other. A direction in which the upper surface 3Aa and the lower surface 3Ab of the support body 3A oppose each other is defined as an up-down direction (i.e., the vertical direction as viewed in FIG. 1). When the support body 3A is seen in plan view along the direction perpendicular to the upper surface 3Aa of the planar portion, a place of the planar portion of the support body 3A on which the projecting portion 3Ad is provided is defined as the center portion and a region of the planar portion of the support body 3A in a radially outward portion relative to the center portion is defined as a peripheral edge portion.

As illustrated in FIG. 2, the support portions 3Ac of the support body 3A project in the up-down direction from respective vertices of the peripheral edge portion of the lower surface 3Ab. As is described in detail, the planar portion is formed by a rectangular plate and the plurality of support portions 3Ac therefore project from the vertices of the peripheral edge portion in the outer side portion relative to the center portion. Positions of end portions of the support portions 3Ac at the lower surface 3Ab side are positions which are farther from the lower surface 3Ab than the projecting portion 3Ad.

Although the four support portions 3Ac project from the respective vertices of the rectangular plate-shaped planar portion of the support body 3A in FIG. 2, the support portions 3Ac may not necessarily project from all of the vertices of the planar portion. It is sufficient that the support portions 3Ac project from at least one of the upper surface 3Aa and the lower surface 3Ab of the planar portion.

Although the projecting portion 3Ad and the support portions 3Ac are preferably integrally molded with the planar portion, the projecting portion 3Ad and the support portions 3Ac as separate bodies may be bonded to the planar portion.

The piezoelectric body 4A is provided on the upper surface 3Aa of the support body 3A. The piezoelectric body 4A preferably has a rectangular plate shape. The piezoelectric body 4A is arranged so as to overlap the projecting portion 3Ad when the support body 3A is seen in plan view along the direction perpendicular to the upper surface 3Aa. Therefore, the piezoelectric body 4A and the projecting portion 3Ad overlap with each other when seen in plan view in the above-described manner. To be more specific, the piezoelectric body 4A covers the projecting portion 3Ad when seen in plan view in the above-described manner. The outer peripheral edge of the piezoelectric body 4A is located in an outer side portion relative to the outer peripheral edge of the projecting portion 3Ad. The shape of the piezoelectric body 4A is not particularly limited. The piezoelectric body 4A is made of, for example, a piezoelectric single crystal, piezoelectric ceramics, or the like.

The second power generation element 2B has the same configuration as the first power generation element 2A. The second power generation element 2B includes a support body 3B and a piezoelectric body 4B. The support body 3B includes a planar portion having an upper surface 3Ba as one main surface and a lower surface 3Bb as the other main surface, a projecting portion 3Bd, and support portions 3Bc as leg portions. The first power generation element 2A and the second power generation element 2B are arranged so as to be adjacent to each other in the up-down direction. That is to say, the first power generation element 2A and the second power generation element 2B overlap with each other in the direction perpendicular to the upper surface 3Aa. To be more specific, the pair of adjacent power generation elements are arranged such that the lower surface 3Ab of the support body 3A of the first power generation element 2A and the upper surface 3Ba of the support body 3B of the second power generation element 2B oppose each other. The first power generation element 2A and the second power generation element 2B overlap with each other with the support portions 3Ac of the first power generation element 2A interposed therebetween.

It is sufficient that the support portions project from the peripheral edge portion of at least the main surface of one main surface and the other main surface of the planar portion of at least one power generation element of the pair of adjacent power generation elements at the other power generation element side, the peripheral edge portion being located in the outer side portion relative to the center portion. That is to say, in FIG. 1, the support portions 3Ac of the first power generation element 2A are important support portions whereas the support portions 3Bc are not as important. Furthermore, it is sufficient that the support portions are provided between the first power generation element 2A and the second power generation element 2B. For example, the configuration in which the first power generation element 2A includes no support portion whereas the second power generation element 2B includes support portions projecting to the first power generation element 2A side is also encompassed in the scope of the present invention.

In the piezoelectric power generation device 1, the support portions 3Bc are support points, the piezoelectric body 4A is a force point, and the projecting portion 3Bd is an action point. When the piezoelectric body 4A is pressed to the lower surface side, the projecting portion 3Bd acts on an external part.

Figure 4:
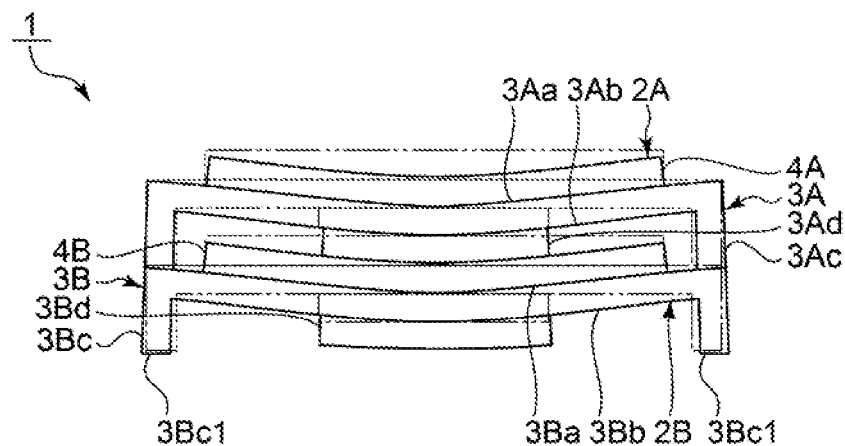
FIG. 4 is a front view of the piezoelectric power generation device, which illustrates deformation of the piezoelectric power generation device when a piezoelectric body of the first power generation element is pressed to the lower side in the first embodiment of the present invention.

When the piezoelectric power generation device 1 is not pressed, the piezoelectric power generation device 1 is in a state shown in FIG. 1. The projecting portion 3Ad of the support body 3A of the first power generation element 2A makes contact with the piezoelectric body 4B of the second power generation element 2B which is directly overlapped therewith at the side of the lower surface 3Ab of the support body 3A. When the piezoelectric power generation device 1 is pressed, the piezoelectric power generation device 1 is deformed as illustrated in FIG. 4. When the piezoelectric body 4A of the first power generation element 2A is pressed downwardly as viewed in FIG. 4, the projecting portion 3Ad provided on the lower surface 3Ab of the support body 3A of the first power generation element 2A is deformed in the downward direction. The projecting portion 3Ad of the first power generation element 2A presses the piezoelectric body 4B of the second power generation element 2B and the piezoelectric body 4B is deformed in the downward direction. Accordingly, the piezoelectric bodies 4A and 4B of the first and second power generation elements 2A and 2B are deformed simultaneously in the same manner. A piezoelectric effect with the deformation generates electric charges and electric power can be taken. When the pressing on the piezoelectric power generation device 1 is stopped, the piezoelectric power generation device 1 is returned to the state of FIG. 1.

Figure 5:
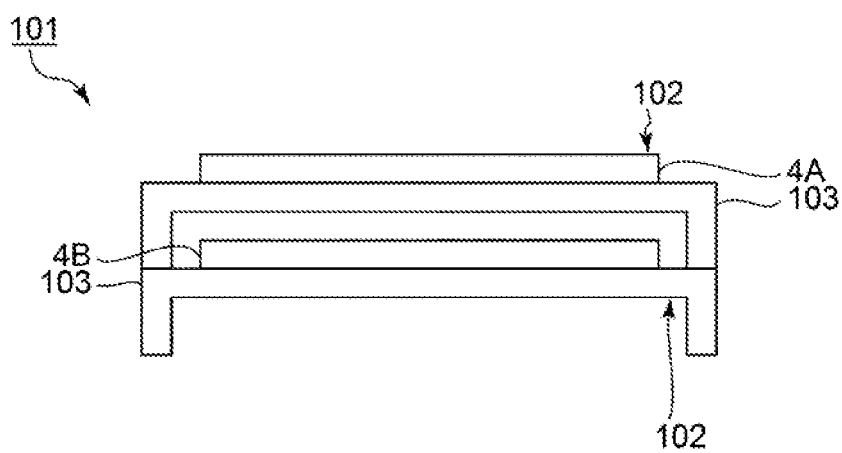
FIG. 5 is a front view of a piezoelectric power generation device in a comparative example.

Hereinafter, difference between the first embodiment and a comparative example will be described. FIG. 5 is a front view of a piezoelectric power generation device in the comparative example. In this embodiment, the support bodies 103 of respective power generation elements 102 do not include the projecting portion of the embodiment of FIG. 1. The piezoelectric power generation device 101 has the same configuration as that of the piezoelectric power generation device 1 in the first embodiment other than the above-described point.

Figure 6:
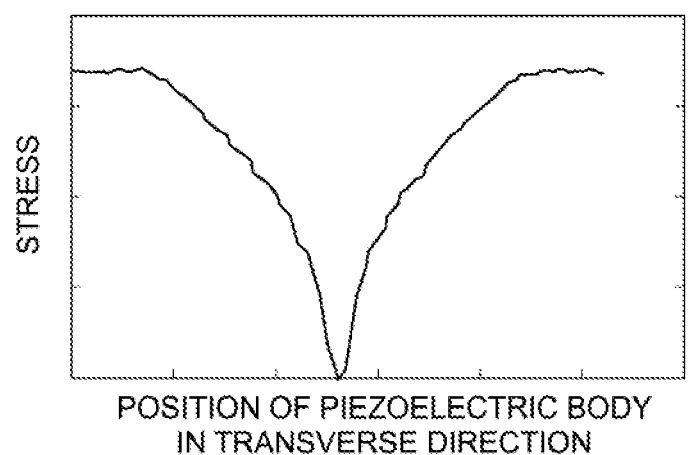
FIG. 6 is a graph illustrating distribution of stress, which is generated when a center portion of a piezoelectric body is pressed to the lower side, in a transverse direction of the center portion of the piezoelectric body in the comparative example.

When the piezoelectric body 4A is pressed, stress in accordance with the pressure amount thereof is generated. For example, when the center portion of the piezoelectric body 4A is pressed, the stress is distributed about the pressed portion as a center. FIG. 6 is a graph illustrating the distribution of the stress which is generated when the center portion of the piezoelectric body is pressed downwardly, in a transverse direction of the center portion of the piezoelectric body in the comparative example. In this case, the stress is concentrated on a portion on which the piezoelectric body 4A is pressed, that is, the center portion thereof. Concentration of the stress at one point causes the piezoelectric body 4A to sometimes break.

Figure 7:
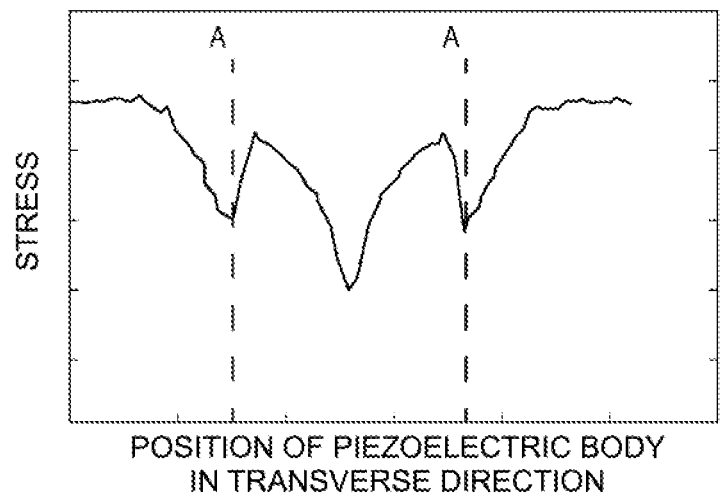
FIG. 7 is a graph illustrating distribution of stress, which is generated when a center portion of the piezoelectric body is pressed to the lower side, in a transverse direction of the center portion of the piezoelectric body in the first embodiment of the present invention.

On the other hand, FIG. 7 is a graph illustrating distribution of the stress which is generated when the center portion of the piezoelectric body is pressed downwardly, in a transverse direction of the center portion of the piezoelectric body in the first embodiment. Dashed lines A in FIG. 7 indicate positions of the outer peripheral edge of the projecting portion of the support body. As shown in FIG. 7, the maximum value of the stress is smaller in the piezoelectric power generation device 1 than in the comparative example.

In the first embodiment, the support body 3A of the first power generation element 2A includes the projecting portion 3Ad. The length in the up-down direction (vertical direction in FIG. 1) is defined as the thickness of the support body. As described above, the center portion of the projecting portion 3Ad and the center portion of the piezoelectric body 4A overlap (are preferably congruent) when seen in plan view from the side of the upper surface 3Aa of the support body 3A. Therefore, the thickness of the support portions 3Ac is large in the portion on which the stress is concentrated when the center portion of the piezoelectric body 4A is pressed. The thickness of the support body is different between the center portion and the peripheral edge portion. With this, concentration of the stress that is applied to the piezoelectric body when the center portion of the piezoelectric body is pressed can be moderated. That is to say, the maximum value of the stress can be decreased and the distribution of the stress can be made more uniform. Accordingly, the piezoelectric power generation device that makes the piezoelectric body hard to be broken and has high power generation efficiency can be provided.

It should be noted that the center portion of the support body, the center portion of the projecting portion of the support body, and the center portion of the piezoelectric body may not necessarily overlap with one another when seen in plan view from the side of the upper surface of the support body. It is needless to say that as in the first embodiment, overlap of the center portion of the projecting portion 3Ad and the center portion of the piezoelectric body 4A when seen in plan view in the above-described manner can moderate concentration of the stress. Furthermore, the center portion of the piezoelectric body 4A and the center portion of the support body 3A overlap with each other when seen in plan view in the above-described manner, so that the piezoelectric body 4A can be largely deformed, thereby effectively enhancing the power generation efficiency.

The planar shapes of the projecting portions 3Ad and 3Bd of the support bodies 3A and 3B of the first and second power generation elements 2A and 2B are preferably circular shape. Accordingly, the distribution of the stress can be made more uniform.

As illustrated in FIG. 2, in the first embodiment, the support portions 3Ac of the first power generation element 2A are provided at the respective vertices of the lower surface 3Ab of the support body 3A. Therefore, the support body 3A can be easily deformed when being pressed to the lower side. The same holds true for the second power generation element 2B. A spring constant of the piezoelectric power generation device 1 for the above-described deformation is low. Accordingly, power can be generated with a small load, thereby enhancing the power generation efficiency.

Furthermore, the support portions 3Ac and 3Bc of the first and second power generation elements 2A and 2B are arranged isotropically relative to the center portions of the support bodies 3A and 3B, respectively, when seen in bottom view from the side of the lower surface 3Bb of the support body 3B of the second power generation element 2B. This arrangement manner enables the support bodies 3A and 3B to be isotropically deformed. Therefore, the distribution of the stress can be made uniform. Accordingly, the power generation efficiency can be enhanced.

The support bodies may have polygonal planar shapes other than the rectangular or circular planar shapes. Also in this case, the support portions are preferably arranged isotropically relative to the center portions of the support bodies when seen in bottom view from the side of the lower surface of the support body.

As illustrated in FIG. 1, in the embodiment, the outer peripheral edge of the piezoelectric body 4A of the first power generation element 2A is located (extends) outwardly of the outer peripheral edge of the projecting portion 3Ad of the support body 3A. In the same manner, the outer peripheral edge of the piezoelectric body 4B of the second power generation element 2B is also located (extends) radially outwardly if the outer peripheral edge of the projecting portion 3Bd of the support body 3B. Therefore, the support bodies 4A and 4B can be largely deformed. In addition, the spring constant of the piezoelectric power generation device 1 can be lowered because the areas of the projecting portion 3Ad and 3Bd are small.

Figure 8:
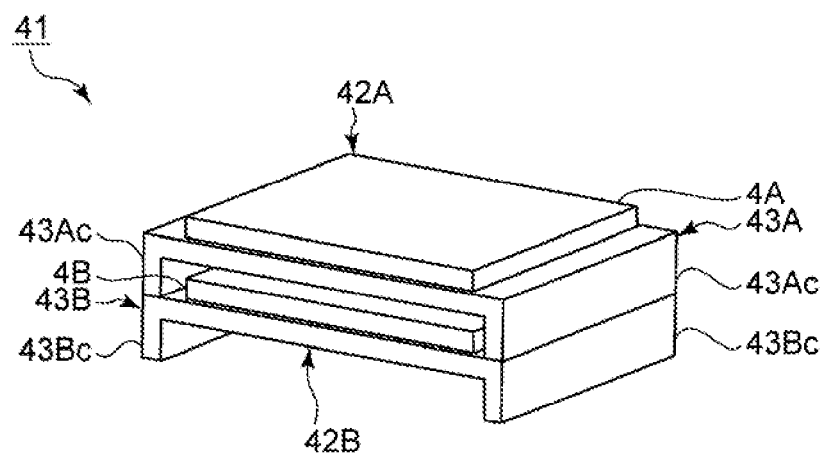
FIG. 8 is a perspective view of a piezoelectric power generation device according to a first variation on the first embodiment of the present invention.

As shown in FIG. 8, in a modified piezoelectric power generation device 41 support portions 43Ac may extend across the entire two opposing sides on the outer peripheral edge of a support body 43A of a first power generation element 42A. This increases the bonding strength between the first power generation element 42A and a second power generation element 42B. Similar support portions 43Bc may be provided on a support body 43B of the second power generation element 42B.

The piezoelectric power generation device 1 in the first embodiment is mounted on an external part from the lower side of the second power generation element 2B. In the first embodiment, end portions 3Bc1 of the support portions 3Bc of the second power generation element 2B at the lower side are located at the lower side relative to the projecting portion 3Bd. In this case, the piezoelectric power generation device 1 is supported by the support portions 3Bc of the second power generation element 2B. Therefore, when the first power generation element 2A is pressed downwardly, as viewed in FIG. 1, the piezoelectric bodies 4A and 4B of the first and second power generation elements 2A and 2B can be easily deformed.

A position at which the support portions are provided is not limited to the lower surface of the support body. For example, the support portions may be provided on the upper surface and the lower surface of the support bodies of the first and second power generation elements. In this case, for example, the support portions of the first power generation element and the support portions of the second power generation element may be bonded to each other.

The second power generation element may have the configuration which is different from that of the first power generation element.

Figure 9:
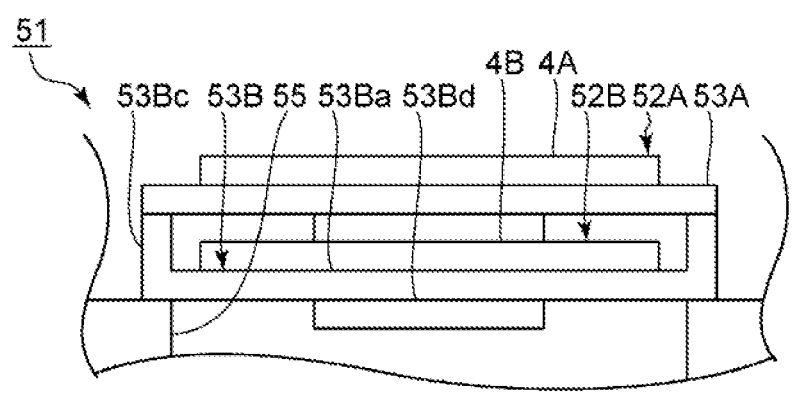
FIG. 9 is a partially cutout front view illustrating an example in which a piezoelectric power generation device according to a second variation on the first embodiment of the present invention is mounted.

A piezoelectric power generation device 51 in accordance with a second variation of the first embodiment is illustrated in FIG. 9. In this variation, support portions 53Bc are provided on an upper surface 53Ba of a support body 53B of a second power generation element 52B whereas no support portion is provided on a support body 53A of a first power generation element 52A. The piezoelectric power generation device 51 can be mounted on a part with a recess portion 55. To be more specific, the piezoelectric power generation device 51 can be mounted in the case in which a projecting portion 53Bd of the support body 53B of the second power generation element 52B is located in the recess portion 55 when it is mounted.

In the first embodiment, the projecting portion 3Ad of the support body 3A of the first power generation element 2A makes contact with the piezoelectric body 4B of the second power generation element 2B. With this contact, when the first power generation element 2A is pressed downwardly (as viewed in FIG. 1), the second power generation element 2B can be deformed with the same extent as that of the deformation of the first power generation element 2A. It should be noted that the projecting portion of the support body of the first power generation element does not necessarily have to make contact with the piezoelectric body of the second power generation element. It is sufficient that at least the piezoelectric body of the second power generation element is pressed by the above-described projecting portion when the first power generation element is pressed downwardly.

Although not illustrated in the drawings, electrodes are preferably provided on the upper surfaces 3Aa and 3Ba and the lower surfaces 3Ab and 3Bb of the piezoelectric bodies 4A and 4B of the first and second power generation elements 2A and 2B. Extended electrodes are respectively connected to those electrodes. The piezoelectric bodies 4A and 4B are electrically connected to an external part with the extended electrodes. It should be noted that the configuration in which the piezoelectric bodies are electrically connected to the external part is not particularly limited.

For example, electrode films may be provided so as to cover the upper surfaces of the piezoelectric bodies of the first and second power generation elements. In the same manner, electrode films may be provided so as to cover the lower surfaces of the respective piezoelectric bodies. When the support bodies are made of metal, for example, it is sufficient that insulating films are provided between the electrode films on the lower surfaces of the piezoelectric bodies and the upper surfaces of the support bodies in the respective power generation elements. In addition, it is sufficient that an insulating film is provided between the electrode film on the upper surface of the piezoelectric body of the second power generation element and the projecting portion of the support body of the first power generation element. With the insulating films, electric short-circuit between the respective electrode films and the respective support bodies can be prevented. When the respective support bodies are made of an insulating material, short-circuit does not occur between the respective electrodes and the respective support bodies.

For example, bonding wires, flexible Cu substrates, or the like can be used as the above-described extended electrodes.

Second Embodiment

Figure 10:
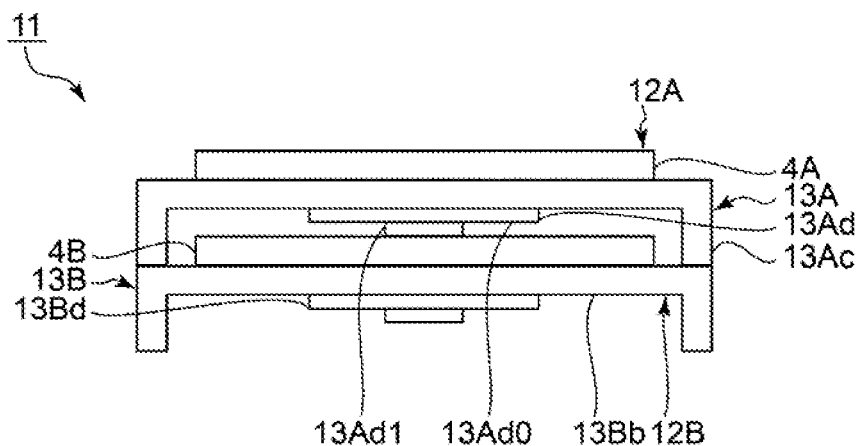
FIG. 10 is a front view of a piezoelectric power generation device according to a second embodiment of the present invention.

FIG. 10 is a front view of a piezoelectric power generation device according to a second embodiment of the present invention.

In piezoelectric power generation device 11, the shapes of projecting portions 13Ad and 13Bd of support bodies 13A and 13B of first and second power generation elements 12A and 12B are different from those in the first embodiment. Otherwise, the piezoelectric power generation device 11 has the same configuration as that of the piezoelectric power generation device 1 in the first embodiment.

The projecting portion 13Ad of the support body 13A of the first power generation element 12A has a base portion 13Ad0 and a step portion 13Ad1. The base portion 13Ad0 is provided on the lower surface of the planar portion of the support body 13A and portion 13Ad0 projects from a center portion of the planar portion of the support body 13A. The base portion 13Ad0 preferably has a circular shape when the support body 13A is seen in bottom view along a direction perpendicular to the lower surface of the support body 13A. The center of the support body 13A and the center of the base portion 13Ad0 overlap, and are preferably coincident, with each other.

The step portion 13Ad1 is provided on the surface of the base portion 13Ad0 at the opposite side to the planar portion of the support body 13A. The step portion 13Ad1 projects from a center portion of the base portion 13Ad0. The step portion 13Ad1 preferably has a circular shape when the support body 13A is seen in bottom view along the direction perpendicular to the lower surface of the support body 13A. The center of the base portion 13Ad0 and the center of the step portion 13Ad1 overlap, and are preferably coincident, with each other. When the support body 13A is seen in plan view along a direction perpendicular to the upper surface of the above-described planar portion, a place of the planar portion of the base portion 13Ad0 on which the step portion 13Ad1 is provided is defined as the center portion and a region of the planar portion of the base portion 13Ad0 radially outward relative to the center portion is defined as a peripheral edge portion. The support body 13A of the first power generation element 12A is formed such that the thickness of the center portion (made up of the adjacent sections of the base portion 13Ad0 and the step portion 13Ad1) of the projecting portion 13Ad is larger than the thickness of the peripheral edge portion which is located radially outward of the step portion 13Ad1. Other than at the support portions 13Ac, the thickness of the support body 13A is the largest in a region where the step portion 13Ad1 is provided. A region corresponding to the portion of the base portion 13Ad0 located radially outside of the step portion 13Ad1 has the second largest thickness. The portion of the support body 13A in which the projecting portion 13Ad is not provided has the smallest thickness. Thus, the support body 13A has distribution of the thickness.

That is to say, the thickness of the support body 13A is the largest in a portion on which stress is most concentrated when the center portion of the piezoelectric body 4A is pressed. As described above, the region in which the base portion 13Ad0 of the projecting portion 13Ad is provided has the second largest thickness. Therefore, the thickness of the support body 13A is large also in the surrounding of the portion on which the stress is concentrated at the highest level. The same holds true for the second power generation element 12B. Accordingly, concentration of the stress can be further moderated.

Figure 11:
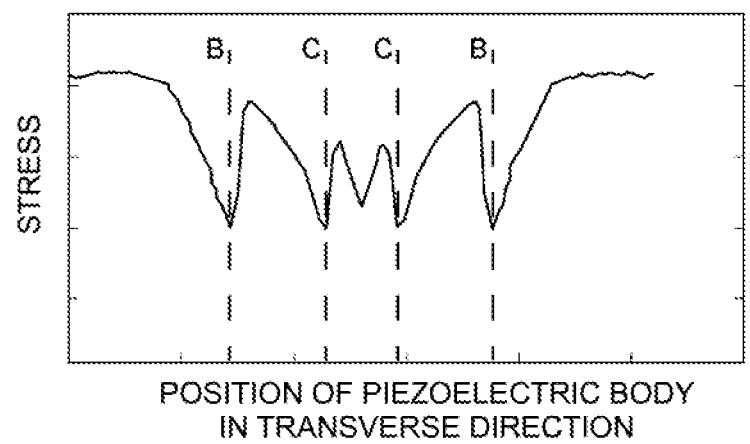
FIG. 11 is a graph illustrating distribution of stress, which is generated when a center portion of a piezoelectric body is pressed to the lower side, in a transverse direction of the center portion of the piezoelectric body in the second embodiment of the present invention.

FIG. 11 is a graph illustrating distribution of the stress, which is generated when the center portion of the piezoelectric body is pressed to the lower side, in a transverse direction of the center portion of the piezoelectric body in the second embodiment. Dashed lines B and C in FIG. 11 indicate positions of the outer peripheral edges of the respective stages of the projecting portion of the support body.

As illustrated in FIG. 11, stress is effectively dispersed and the maximum value of the stress is smaller than in the comparative example of FIG. 5. Accordingly, the piezoelectric power generation device that makes the piezoelectric body hard to be broken and has high power generation efficiency can also be provided in the second embodiment.

As described above, the position of the step portion of the above-described projecting portion is not particularly limited. A position at which the piezoelectric body is pressed with the projecting portion can be adjusted by adjusting arrangement of the step portion.

Figure 12:
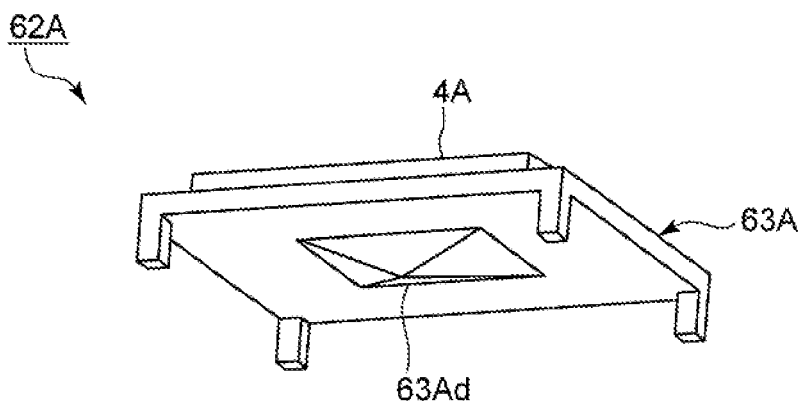
FIG. 12 is a perspective view of a first power generation element in a first variation on the second embodiment of the present invention.
Figure 13:
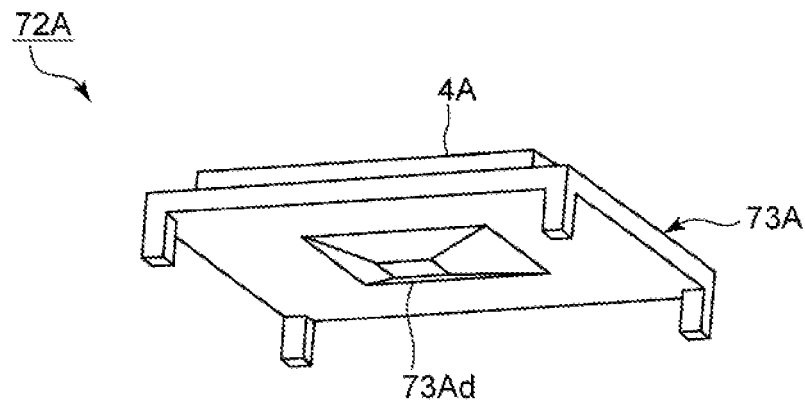
FIG. 13 is a perspective view of a first power generation element in a second variation on the second embodiment of the present invention.

The projecting portion may have a step portion of equal to or more than one stage. In this case, the stress can be further dispersed. Alternatively, for example, as in a first power generation element 62A in a first variation on the second embodiment, which is illustrated in FIG. 12, a projecting portion 63Rd of a support body 63A may have a quadrangular pyramid-like shape. Even in this case, the same effects as those in the second embodiment can be provided. As in a first power generation element 72A in a second variation on the second embodiment, which is illustrated in FIG. 13, a projecting portion 73Rd of a support body 73A may have a truncated quadrangular pyramid-like shape. Even in this case, the same effects as those in the second embodiment can be provided.

Third Embodiment

Figure 14:
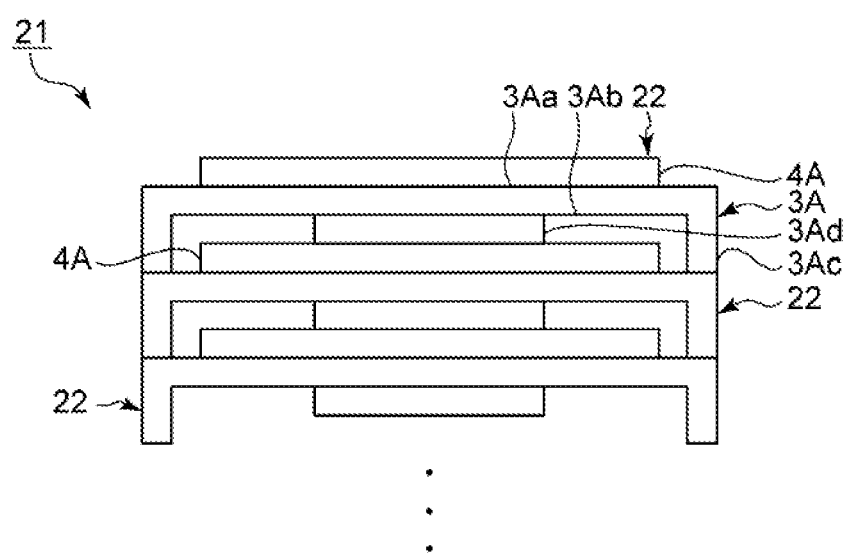
FIG. 14 is a front view of a piezoelectric power generation device according to a third embodiment of the present invention.

FIG. 14 is a front view of a piezoelectric power generation device according to a third embodiment.

A piezoelectric power generation device 21 is different from the first embodiment in a point that it includes three power generation elements 22 (alternatively it can have four or more stacked power generating elements). The respective power generation elements 22 have the same configuration as that of the first power generation element 2A in the first embodiment.

In the piezoelectric power generation device 21 of this embodiment, the plurality of power generation elements 22 are laminated on top of the other. The respective power generation elements 22 overlap with one another in the same manner as the first and second power generation elements 2A and 2B in the first embodiment. When the piezoelectric body 4A of the uppermost power generation element 22 in the piezoelectric power generation device 21 is pressed downwardly as viewed in FIG. 14, the piezoelectric bodies 4A of the respective power generation elements 22, other than the uppermost power generation element 22, are also pressed by the projecting portions 3Ad of the respective support bodies 3A.

The piezoelectric bodies 4A are hard to be deformed as cross-sectional secondary moments of the piezoelectric bodies 4A are larger. The cross-sectional secondary moments of the piezoelectric bodies 4A in the embodiment can be expressed by an equation of $I=bh3/12$ wherein the thickness of each piezoelectric body 4A is h and the length of the piezoelectric body 4A in the transverse direction is b. As apparent from this equation, the unlikeliness of deformation of the piezoelectric body 4A is proportionate to the cube of the thickness of the piezoelectric body 4A.

Figure 15:
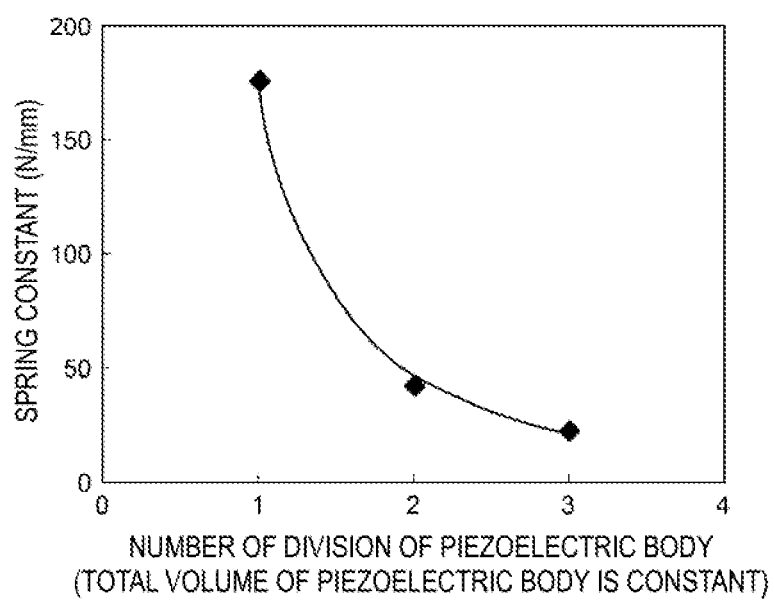
FIG. 15 is a graph illustrating a relation between the number of divisions of a piezoelectric body and a spring constant.

FIG. 15 is a graph illustrating a relation between the number of divisions of the piezoelectric body and a spring constant. The total volume of the piezoelectric body is constant regardless of the number of divisions.

In FIG. 15, when the number of division of the piezoelectric body is 1, that is, the piezoelectric body is not divided. The spring constant when the number of divisions is 2 is lower than that when the number of division of the piezoelectric body is 1. The spring constant when the number of divisions is 3 is lower than that when the number of divisions of the piezoelectric body is 2. It is found that when the total volume of the piezoelectric body is the same, the spring constant is lower as the number of divisions of the piezoelectric body is increased. Therefore, the piezoelectric body is easier to be deformed as the number of divisions of the piezoelectric body is larger.

A curve in FIG. 15 can be expressed by an equation of $y=168.83x-1.849$ wherein the spring constant is y and the number of divisions of the piezoelectric body is x.

By referring to FIG. 14 again, the plurality of piezoelectric bodies 4A are simultaneously pressed in the embodiment. As is obvious from the equation of the cross-sectional secondary moment and FIG. 15, the plurality of piezoelectric bodies 4A can be deformed with a smaller load. Accordingly, power generation efficiency can be further enhanced.

Although the respective power generation elements 22 have the same configuration in this embodiment, they may have different configurations. For example, the plurality of power generation elements may include a power generation element with no support portion. In this case, it is sufficient that this power generation element overlaps with the adjacent power generation element with the support portions of the power generation element adjacent to the power generation element interposed therebetween.

Alternatively, the respective projecting portions of the respective support bodies may have different shapes. However, it is preferable that the respective projecting portions 3Ad have the same shape. With the same shape of the respective projecting portions 3Ad, the respective support bodies 4A can be deformed with the same curvature. Accordingly, the power generation amounts of the respective power generation elements 22 can be made equivalent to one another. This can reduce electric loss when the power generation elements 22 are connected in parallel.

Fourth Embodiment

Figure 16:
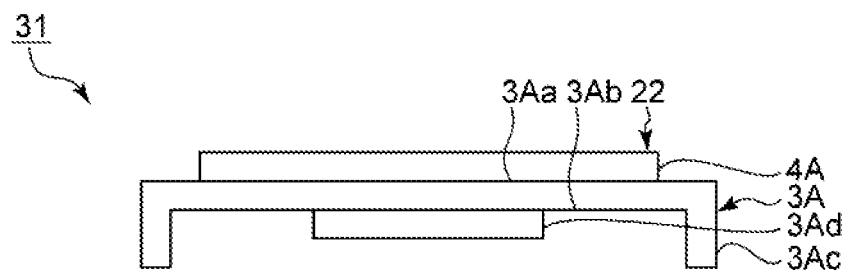
FIG. 16 is a front view of a piezoelectric power generation device according to a fourth embodiment of the present invention.

FIG. 16 is a front view of a piezoelectric power generation device according to a fourth embodiment. Piezoelectric power generation device 31 is different from the first embodiment in that it includes a single power generation element 22. The power generation element 22 has the same configuration as the first power generation element 2A in the first embodiment.

Thus, the piezoelectric power generation device 31 may be configured by one power generation element 22. Also in this case, stress can be dispersed in the same manner as the first embodiment. Therefore, the piezoelectric body 4A is hard to be broken.

As in the second variation on the first embodiment, which is illustrated in FIG. 9, the support body of the piezoelectric power generation device may include no support portion when it is mounted on a part with a recess portion.

Fifth Embodiment

Figure 17:
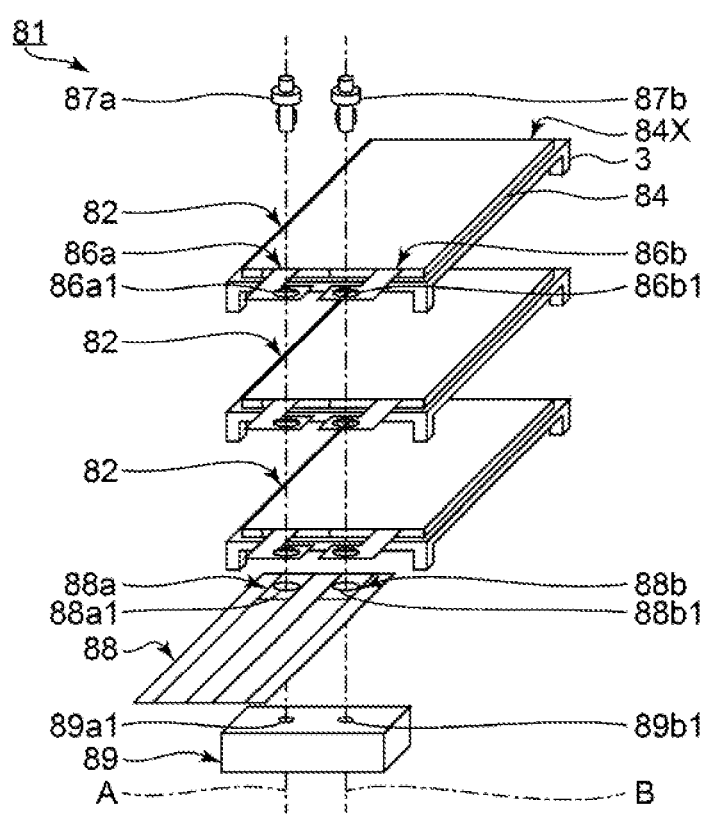
FIG. 17 is an exploded perspective view of a piezoelectric power generation device according to a fifth embodiment of the present invention.

FIG. 17 is an exploded perspective view of a piezoelectric power generation device according to a fifth embodiment. In this embodiment, piezoelectric power generation device 81 differs from the third embodiment in that it includes first and second external connection terminals 86a and 86b which are respectively connected to piezoelectric bodies 84 of respective power generation elements 82. The piezoelectric power generation device 81 includes first and second pins 87a and 87b that are electrically connected to the plurality of first and second external connection terminals 86a and 86b and a flexible print substrate 88. Furthermore, the piezoelectric power generation device 81 includes a base member 89 to which the first and second pins 87a and 87b are fixed. The piezoelectric power generation device 81 is also different from the piezoelectric power generation device in the third embodiment in these points.

Each power generation element 82 has a piezoelectric element 84X including the piezoelectric body 84 and the first and second external connection terminals 86a and 86b. The piezoelectric element 84X is described in detail below.

Figure 18:
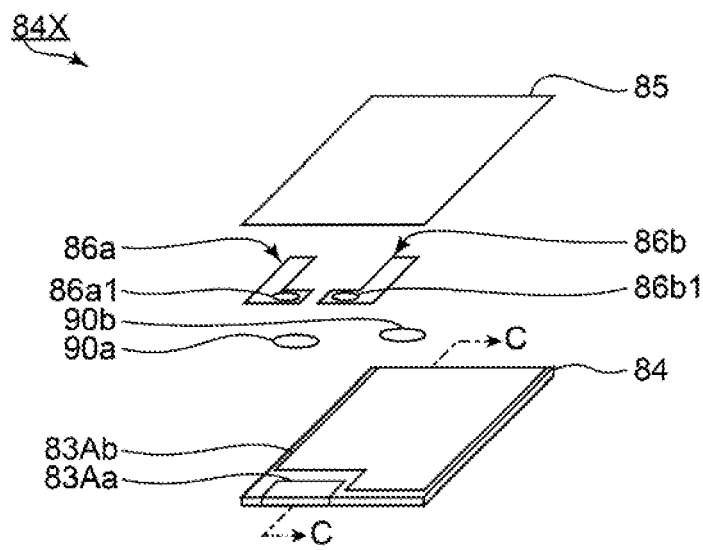
FIG. 18 is an exploded perspective view of a piezoelectric element in the fifth embodiment of the present invention.
Figure 19:
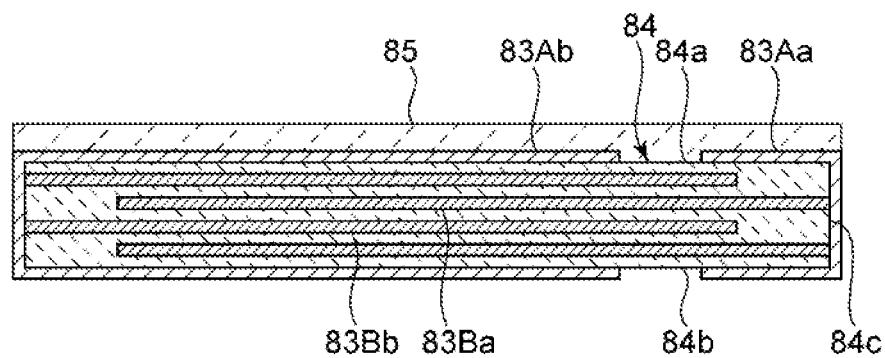
FIG. 19 is a cross-sectional view along line C-C in FIG. 18.

FIG. 18 is an exploded perspective view of the piezoelectric element in the fifth embodiment of the present invention. FIG. 19 is a cross-sectional view along line C-C in FIG. 18. In FIG. 19, the first and second external connection terminals are omitted.

As illustrated in FIG. 19, in the fifth embodiment, the piezoelectric body 84 is formed by laminating a plurality of piezoelectric layers together. The piezoelectric body 84 is made of, for example, PZT-based piezoelectric ceramics.

A plurality of first and second inner electrodes 83Ba and 83Bb are laminated between the plurality of piezoelectric layers. To be more specific, the first inner electrodes 83Ba and the second inner electrodes 83Bb are alternately laminated so as to oppose each other with the piezoelectric layers interposed therebetween.

A first outer electrode 83Aa is continuously provided from an upper surface 84a to a lower surface 84b of the piezoelectric body 84 in FIG. 19 while passing through a side surface 84c. In the same manner, a second outer electrode 83Ab is continuously provided from the upper surface 84a to the lower surface 84b of the piezoelectric body 84 while passing through the side surface 84c. The first and second outer electrodes 83Aa and 83Ab may be provided on the same side surface 84c or may be provided on the different side surfaces 84c. It is sufficient that the first and second outer electrodes 83Aa and 83Ab are provided so as not to be electrically connected to each other.

The first and second outer electrodes 83Aa and 83Ab can be formed by, for example, a sputtering method. Each of the first and second outer electrodes 83Aa and 83Ab is preferably a layered metal film formed by laminating a nichrome layer, a monel layer, and an Au layer in this order from the piezoelectric body 84 side. However, the materials of the first and second outer electrodes 83Aa and 83Ab are not limited to the above-mentioned ones.

The plurality of first inner electrodes 83Ba are connected to the first outer electrode 83Aa. The plurality of second inner electrodes 83Bb are connected to the second outer electrode 83Ab.

A cover layer 85 is provided on the upper surface 84a of the piezoelectric body 84. The cover layer 85 is made of, for example, polyimide. The thickness of the cover layer 85 is not particularly limited but may be, for example, 12.5 μm. The cover layer 85 can be bonded to the piezoelectric body 84 with an epoxy-based adhesive or the like. Foreign matters are made hard to adhere to the first and second outer electrodes 83Aa and 83Ab by providing the cover layer 85. In addition, the cover layer 85 can increase the strength of the piezoelectric element 84X. It should be noted that the piezoelectric element 84X may include no cover layer 85.

As illustrated in FIG. 18, the first external connection terminal 86a is connected to the first outer electrode 83Aa with a conductive adhesive 90a interposed therebetween. In the same manner, the second external connection terminal 86b is connected to the second outer electrode 83Ab with a conductive adhesive 90b interposed therebetween.

The first inner electrode 83Ba and the second inner electrode 83Bb illustrated in FIG. 19 have different potentials when the piezoelectric body 84 is deformed. The first and second external connection terminals 86a and 86b are electrically connected to the first and second inner electrodes 83Ba and 83Bb with the first and second outer electrodes 83Aa and 83Ab interposed therebetween, respectively. The first external connection terminal 86a and the second external connection terminal 86b are connected to different potentials. As a result, power can be taken out of the power generation element 82 with the first and second external connection terminals 86a and 86b interposed therebetween.

Each of the first and second external connection terminals 86a and 86b can be formed by, for example, laminating an Au layer on a main material made of phosphor bronze. As a foundation of the Au layer, a Ni layer may be laminated on the main material made of phosphor bronze. For example, an epoxy-based adhesive containing Ag, or the like, can be used for the conductive adhesives 90a and 90b.

Portions of the first and second external connection terminals 86a and 86b, which are connected to the first and second inner electrodes 83Aa and 83Ab, are interposed between the first and second outer electrodes 83Aa and 83Ab and the cover layer 85.

Referring again to FIG. 17, through-holes 86a1 and 86b1 are provided on the first and second external connection terminals 86a and 86b, respectively. The first external connection terminals 86a of the plurality of power generation elements 82 are arranged so as to be aligned in the direction in which the plurality of power generation elements 82 are laminated. The second external connection terminals 86b of the plurality of power generation elements 82 are also arranged so as to be aligned in the direction in which the plurality of power generation elements 82 are laminated.

As is indicated by dashed line A in FIG. 17, the above-described first pin 87a is inserted into the through-holes 86a1 of the respective first external connection terminals 86a. As is indicated by dashed line B, the above-described second pin 87b is inserted into the through-holes 86b1 of the respective second external connection terminals 86b. To be more specific, second portions, which will be described later, of the first and second pins 87a and 87b are inserted into the through-holes 86a1 and 86b1.

Figure 20:
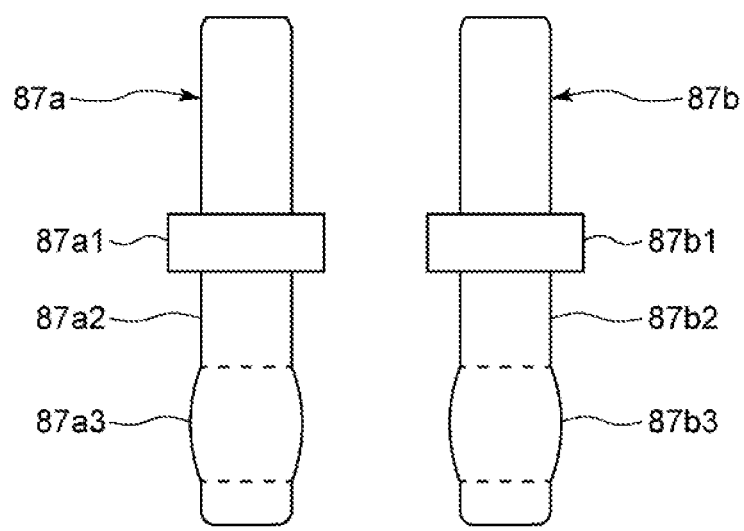
FIG. 20 is a front view of first and second pins in the fifth embodiment of the present invention.
Figure 21:
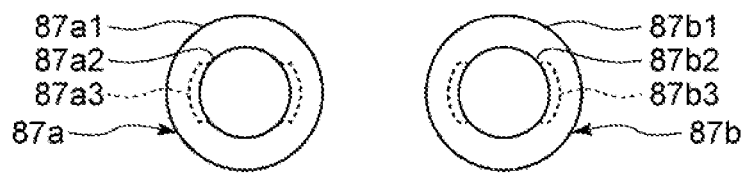
FIG. 21 is a plan view of the first and second pins in the fifth embodiment of the present invention.

FIG. 20 is a front view of the first and second pins in the fifth embodiment. FIG. 21 is a plan view of the first and second pins in the fifth embodiment. Dashed lines in FIG. 20 indicate boundaries between first to third portions.

As illustrated in FIG. 20, the first pin 87a has first to third portions 87a1 to 87a3. The first portion 87a1 is continuous to the second portion 87a2 and the second portion 87a2 is continuous to the third portion 87a3.

As illustrated in FIG. 21, in this embodiment, the planar (cross-sectional) shapes of the first and second portions 87a1 and 87a2 are circular. The planar (cross-sectional) shape of the third portion 87a3 are circular shapes with two opposing protrusions added to the circular shape. The planar shapes of the first to third portions 87a1 to 87a3 are not limited to the above-described shapes.

The cross-sectional area of the first portion 87a1 is larger than the planar area (opening) of the through-hole 86a1 of first external connection terminal 86a illustrated in FIG. 17. The cross-sectional area of the second portion 87a2 is equal to or smaller than the planar area (opening) of the through-hole 86a1 and smaller than the cross-sectional area of the first portion 87a1.

A maximum dimension between two points on the outer peripheral edge when seen in plan view is a width. In this case, the width of the third portion 87a3 is smaller than the width of the first portion 87a1 and is larger than the width of the second portion 87a2 (see FIG. 21).

The second pin 87b has the same configuration as that of the first pin 87a and includes first to third portions 87b1 to 87b3. The cross-sectional area of the first portion 87b1 is larger than the planar area (opening) of the through-hole 86b1 of second external connection terminal 86b illustrated in FIG. 17. The cross-sectional area of the second portion 87b2 is equal to or smaller than the planar area (opening) of the through-hole 86b1.

In this embodiment, the diameters of the first portions 87a1 and 87b1 of the first and second pins 87a and 87b are, for example, 1.1 mm. The diameters of the second portions 87a2 and 87b2 are, for example, 0.6 mm. The widths of the third portions 87a3 and 87b3 are, for example, 0.75 mm. Dimensions of the diameters and the widths of the first to third portions 87a1 to 87a3 and 87b1 to 87b3 are not particularly limited and it is sufficient that they satisfy the above-described relations.

The first and second pins 87a and 87b are preferably made of a material containing appropriate metal. In this embodiment, each of the first and second pins 87a and 87b are preferably formed by laminating an Au layer on a main material made of brass. As a foundation of the Au layer, a Ni layer may be laminated on the main material made of brass.

Referring again to FIG. 17, the piezoelectric power generation device 81 includes the base member 89 which is arranged such that the plurality of first and second external connection terminals 86a and 86b are fastened between the base member 89 and the first portions 87a1 and 87b1 of the first and second pins 87a and 87b illustrated in FIG. 20.

The base member 89 has, for example, a rectangular parallelepiped block shape. The shape of the base member 89 is not particularly limited and may have a case-like shape accommodating therein the plurality of power generation elements 82.

The base member 89 has hole portions 89a1 and 89b1 and is made of appropriate resin. For example, polyphenylene sulfide (PPSG) containing glass fiber, or the like can be used. In the preferred embodiment, the content of the glass fiber in PPSG is 40%.

A portion of the first pin 87a, which contains the third portion 87a3, is inserted into the hole portion 89a1. To be more specific, the first pin 87a is pressed into the hole portion 89a1. The width of the third portion 87a3 is larger than the width of a cavity (opening) of the hole portion 89a1. The hole portion 89a1 of the base member 89 is however deformed when the first pin 87a is pressed into the hole portion 89a1 because the base member 89 is made of resin. With the deformation, the portion of the first pin 87a, which contains the third portion 87a3, is inserted into the hole portion 89a1. In this way, the first pin 87a is fixed to the base member 89.

As described above, when the first pin 87a is pressed into the hole portion 89a1, the plurality of first external connection terminals 86a are fastened between the first portion 87a1 and the base member 89. The first portion 86a1 and the base member 89 press the plurality of first external connection terminals 86a such that the plurality of first external connection terminals 86a are moved close to each other. This pressure causes the plurality of first external connection terminals 86a to be deformed, so that the plurality of first external connection terminals 86a make contact with each other. The plurality of first external connection terminals 86a are thereby electrically connected to each other.

The external connection terminal 86a of the power generation element 82 which is the closest to the first portion 87a1 among the plurality of power generation elements 82 makes contact with the first portion 86a1 and is fixed in a state in which the plurality of first external connection terminals 86a make contact with each other.

In the same manner, the width of the third portion 87b3 of the second pin 87b is larger than the width of a cavity of the hole portion 89b1. A portion of the second pin 87b, which contains the third portion 87b3, is inserted into the hole portion 89b1 and the second pin 87b is fixed to the base member 89 in a state in which the plurality of second external connection terminals 86b are electrically connected to each other. The widths of the hole portions 89a1 and 89b1 are not particularly limited but are 0.65 mm in the preferred embodiment.

As illustrated in FIG. 21, a minimum dimension between two points on the outer peripheral edge of the third portion 87a3 of the first pin 87a when seen in plan view is preferably smaller than the maximum dimension between the two points on the outer peripheral edge thereof. With these dimensions, the first pin 87a can be easily pressed into the hole portion 89a1 of the base member 89 illustrated in FIG.

17. More preferably, the above-described minimum dimension of the third portion 87a3 is smaller than the dimension of the width of the second portion 87a2. The first pin 87a can therefore be pressed into the hole portion 89a1 more easily.

As illustrated in FIG. 17, the piezoelectric power generation device 81 preferably includes the flexible print substrate 88. The flexible print substrate 88 is preferably fastened between the first and second external connection terminals 86a and 86b of the power generation element 82 which is the closest to the base member 89.

The flexible print substrate 88 preferably includes a base material and a wiring formed on the base material. As the base material, for example, polyimide or the like can be used. As the wiring, appropriate metal such as Cu can be used.

The flexible print substrate 88 has first and second terminals 88a and 88b that are connected to the above-described wiring. First and second through-holes 88a1 and 88b1 are provided in the first and second terminals 88a and 88b, respectively, and the above-described base material. The second portions 87a2 and 87b2 of the first and second pins 87a and 87b are inserted into the first and second through-holes 88a1 and 88b1, respectively.

The first and second terminals 88a and 88b make contact with the first and second external connection terminals 86a and 86b of the power generation element 82 which is the closest to the flexible print substrate 88, respectively. The first and second terminals 88a and 88b are therefore electrically connected to the first and second external connection terminals 86a and 86b, respectively. The piezoelectric power generation device 81 is electrically connected to an external part with the flexible print substrate 88 interposed therebetween.

It should be noted that the piezoelectric power generation device 81 may be connected to a circuit substrate or the like. As the circuit substrate, for example, a circuit substrate configured by forming a wiring on a substrate made of glass epoxy resin or the like can be used.

In the foregoing embodiment, the plurality of first external connection terminals 86a are electrically connected to each other with the first pin 87a and the plurality of second external connection terminals 86b are electrically connected to each other with the second pin 87b. Therefore, the above-described connection can be easily performed without using a bonding material. Accordingly, productivity can be enhanced.

When the above-described connection is performed by soldering or the like, flexibility is easy to be deteriorated in connected portions. Therefore, stress is easy to be concentrated on the connected portions. In order to avoid this risk, portions in which the plurality of first external connection terminals 86a are connected to each other and portions in which the plurality of second external connection terminals 86b are connected to each other are fixed by the first and second pins 87a and 87b, respectively. With this configuration, flexibility is hard to be deteriorated in the above-described connected portions and stress is hard to be concentrated thereon. Accordingly, breakage due to stress that is repeatedly applied is hard to occur.

In addition, the area necessary for the above-described connection is small, thereby reducing the piezoelectric power generation device 81 in size.

Figure 22:
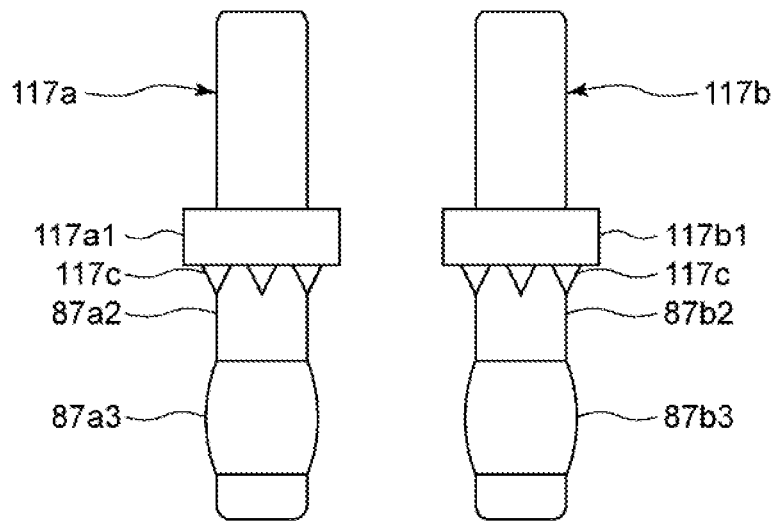
FIG. 22 is a front view of first and second pins in a first variation on the fifth embodiment of the present invention.

Like first and second pins 117a and 117b in a first variation on the fifth embodiment as illustrated in FIG. 22, projections 117c may be provided on the surfaces of first portions 117a1 and 117b1, which make contact with first and second external connection terminals. With the projections, electric connection between the plurality of first external connection terminals and electric connection between the plurality of second external connection terminals can be made more reliably. It should be noted that the number of projections 117c is not particularly limited.

Figure 23:
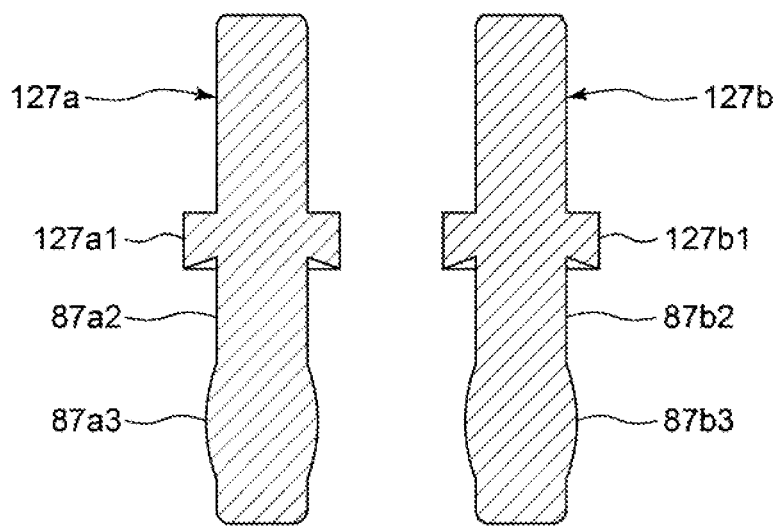
FIG. 23 is a front cross-sectional view of first and second pins in a second variation on the fifth embodiment of the present invention.

Like first and second pins 127a and 127b in a second variation on the fifth embodiment as illustrated in a front cross-sectional view in FIG. 23, the surfaces of first portions 127a1 and 127b1, which make contact with first and second external connection terminals, may be inclined. To be more specific, they may be inclined such that the thicknesses of the first portions 127a1 and 127b1 are smaller toward the inner sides of the surfaces from the outer peripheral edges thereof. With such mortar shapes of the first portions 127a and 127b, electric connection between the plurality of first external connection terminals and electric connection between the plurality of second external connection terminals can be made more reliably.

Sixth Embodiment

Figure 24:
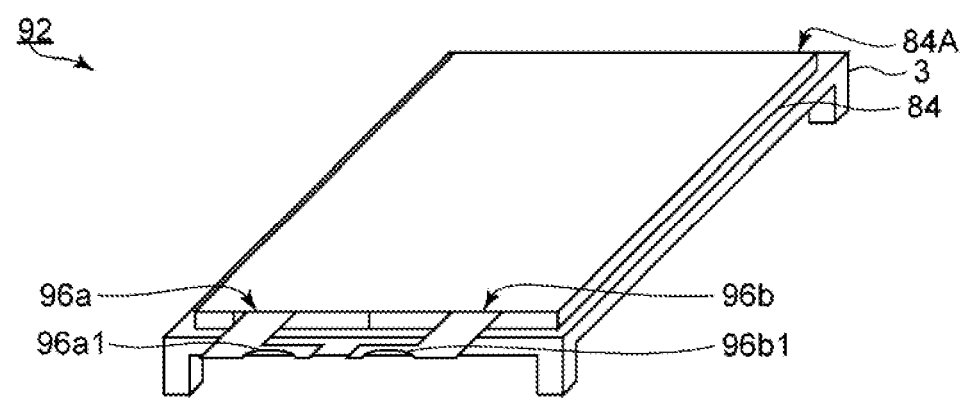
FIG. 24 is a perspective view of a power generation element in a sixth embodiment of the present invention.

FIG. 24 is a perspective view of a piezoelectric element in a sixth embodiment.

A piezoelectric power generation device in accordance with the sixth embodiment is different from the fifth embodiment in that a plurality of first and second external connection terminals 96a and 96b of a power generation element 92 have cutout portions 96a1 and 96b1, respectively. The piezoelectric power generation device in the embodiment has the same configuration as that of the piezoelectric power generation device 81 in the fifth embodiment other than the above-described point.

In the embodiment, second portions of first and second pins are inserted into the cutout portions 96a1 and 96b1 of the first and second external connection terminals 96a and 96b, respectively. Also in the embodiment, the plurality of first external connection terminals 96a are electrically connected to each other and fixed with the first pin. In the same manner, the plurality of second external connection terminals 96b are electrically connected to each other and fixed with the second pin. Accordingly, in the same manner as the fifth embodiment, stress is hard to be concentrated in the above-described connected portions and breakage due to stress that is repeatedly applied is hard to occur. Furthermore, productivity can be enhanced and reduction in size can be achieved.

REFERENCE SIGNS LIST

1 PIEZOELECTRIC POWER GENERATION DEVICE
2A, 2B FIRST AND SECOND POWER GENERATION ELEMENTS
3A, 3B SUPPORT BODY
3Aa, 3Ba UPPER SURFACE
3Ab, 3Bb LOWER SURFACE
3Ac, 3Bc SUPPORT PORTION
3Bc1 END PORTION
3Ad, 3Bd PROJECTING PORTION
4A, 4B PIEZOELECTRIC BODY
11 PIEZOELECTRIC POWER GENERATION DEVICE
12A, 12B FIRST AND SECOND POWER GENERATION ELEMENTS
13A, 13B SUPPORT BODY
13Bb LOWER SURFACE
13Ac SUPPORT PORTION
13Ad, 13Bd PROJECTING PORTION
13Ad0 BASE PORTION

13Ad1 STEP PORTION
21 PIEZOELECTRIC POWER GENERATION DEVICE
22 POWER GENERATION ELEMENT
31 PIEZOELECTRIC POWER GENERATION DEVICE
41 PIEZOELECTRIC POWER GENERATION DEVICE
42A, 42B FIRST AND SECOND POWER GENERATION ELEMENTS
43A, 43B SUPPORT BODY
43Ac, 43Bc SUPPORT PORTION
51 PIEZOELECTRIC POWER GENERATION DEVICE
52A, 52B FIRST AND SECOND POWER GENERATION ELEMENTS
53A, 53B SUPPORT BODY
53Ba UPPER SURFACE
53Bc SUPPORT PORTION
53Bd PROJECTING PORTION
55 RECESS PORTION
62A FIRST POWER GENERATION ELEMENT
63A SUPPORT BODY
63Rd PROJECTING PORTION
72A FIRST POWER GENERATION ELEMENT
73A SUPPORT BODY
73Rd PROJECTING PORTION
81 PIEZOELECTRIC POWER GENERATION DEVICE
82 POWER GENERATION ELEMENT
83Aa, 83Ab FIRST AND SECOND OUTER ELECTRODES
83Ba, 83Bb FIRST AND SECOND INNER ELECTRODES
84 PIEZOELECTRIC BODY
84a UPPER SURFACE
84b LOWER SURFACE
84c SIDE SURFACE
84X PIEZOELECTRIC ELEMENT
85 COVER LAYER
86a, 86b FIRST AND SECOND OUTER ELECTRODES
86a1, 86b1 THROUGH-HOLE
87a FIRST PIN
87a1 TO 87a3 FIRST TO THIRD PORTIONS
87b SECOND PIN
87b1 TO 87b3 FIRST TO THIRD PORTIONS
88 FLEXIBLE PRINT SUBSTRATE
88a, 88b FIRST AND SECOND TERMINALS
88a1, 88b1 FIRST AND SECOND THROUGH-HOLES
89 BASE MEMBER
89a1, 89b1 HOLE PORTION
90a, 90b CONDUCTIVE ADHESIVE
92 POWER GENERATION ELEMENT
96a, 96b FIRST AND SECOND EXTERNAL CONNECTION TERMINALS
96a1, 96b1 CUTOUT PORTION
101 PIEZOELECTRIC POWER GENERATION DEVICE
102 POWER GENERATION ELEMENT
103 SUPPORT BODY
117a, 117b FIRST AND SECOND PINS
117a1, 117b1 FIRST PORTION
117c PROJECTION
127a, 127b FIRST AND SECOND PINS
127a1, 127b1 FIRST PORTION

The invention claimed is:

1. A piezoelectric power generation device comprising:
(a) a first power generation element including:
(i) a first support body having a plate-like planar portion lying in a first plane and having opposed upper and lower main surfaces and a first projecting portion projecting from a center portion of the lower main surface of the first support body, the first projecting portion having an outer periphery when seen in plan view along a direction perpendicular to the first plane; and
(ii) a first piezoelectric body provided on the upper main surface of the first support body and overlapping the first projecting portion when the first support body is seen in plan view along a direction perpendicular to the first plane;
(b) a second power generation element including:
(i) a second support body having a plate-like planar portion lying in a second plane and having opposed upper and lower main surfaces and a second projecting portion projecting from a center portion of the lower main surface of the second support body; and
(ii) a second piezoelectric body provided on the upper main surface of the second support body and overlapping the second projecting portion when the second support body is seen in plan view along a direction perpendicular to the second plane;
(c) a plurality of legs extending from at least one of the power generation elements toward the other of the power generation elements and causing the main lower surface of the first support body and the upper main surface of the second support body to be spaced from and opposed to one another with both the second piezoelectric element and the first projection portion located there between and with the first projection portion contacting the second piezoelectric body, the plurality of legs being located radially outward of the outer periphery of the first projecting portion when the first support body is seen in plan view along a direction perpendicular to the second plane.

2. The piezoelectric power generation device according to claim 1, wherein when the first piezoelectric body is pressed in the direction perpendicular to the first plane and toward the second power generation portion element, the first projection portion presses against the second piezoelectric body.

3. The piezoelectric power generation device according to claim 2, wherein the first projecting portion has a center when seen in plan view along a direction perpendicular to the first plane and a thickness of the first projecting portion as measured in a direction parallel to the first plane is larger at its center than at a peripheral edge portion located radially outward from its center.

4. The piezoelectric power generation device according to claim 3, wherein the first projecting portion is stepped in shape so that at least a first portion of the first projecting portion is wider than a second portion of the first projecting portion as measured in a direction parallel to the first plane.

5. The piezoelectric power generation device according to claim 1, wherein the planar portion of the first support body has a polygonal shape having vertices and the plurality of legs project from respective ones of the vertices.

6. The piezoelectric power generation device according to claim 1, wherein the planar portion of the second support body has a polygonal shape having vertices and the plurality of legs project from respective ones of the vertices.

7. The piezoelectric power generation device according to claim 1, wherein the first projecting portion has a circular planar shape as seen in plan view along the direction perpendicular to the first plane.

8. The piezoelectric power generation device according to claim 1, wherein each of the plurality of legs are longer than the thickness of the first projecting portion.

9. The piezoelectric power generation device according to claim 1, further including at least a third power generation element, all of the power generation elements being stacked one on top of the other.

10. The piezoelectric power generation device according to claim 9, wherein all of the power generation elements have the same structure.

11. The piezoelectric power generation device according to claim 1, wherein the plate-like planar portion of the first support body has first and second opposed peripheral edges and the plurality of legs comprise first and second legs extending along the entirety of the first and second peripheral edges, respectively.

12. The piezoelectric power generation device according to claim 1, wherein:

the first power generation element includes a first external connection terminal electrically connected to the first piezoelectric body, the first external connection terminal having an opening in the form of a through hole or a cut out;

the second power generation element includes second external connection terminal electrically connected to the second piezoelectric body, the second external connection terminal having an opening in the form of a through hole or cut out; and the piezoelectric power generation device further includes:

a pin having a central longitudinal axis, the pin having first, second, and third contiguous portions, a width of the first portion as measured perpendicular to the central longitudinal axis being larger than a width of the second portion as measured perpendicular to the central longitudinal axis and a width of the third portion as measured perpendicular to the central longitudinal axis is smaller than the width of the first portion and is larger than the width of the second portion, the second portion extending through the openings in the first and second external connection terminals; and a base member having an opening into which the third portion of the pin extends so as to electrically connect the first and second external connection terminals and physically fasten the pin, the first and second external connection terminals and the base together.

13. The piezoelectric power generation device according to claim 12, wherein the first and second connection terminals are held in a clamped state between the first portion of the pin and the base member.

14. The piezoelectric power generation device according to claim 12, wherein the longitudinal central axis of the pin extends in a direction perpendicular to the first and third main surfaces.

15. The piezoelectric power generation device according to claim 12, further including a projection on a surface of the pin where the first portion of the pin makes contact with the first external connection terminal.

16. The piezoelectric power generation device according to 12, wherein a surface of the first portion of the pin which makes contact with the first external connection terminal is inclined such that a thickness of the first portion as measured parallel to the central longitudinal axis decreases from a radially outer portion of the first portion toward the central longitudinal axis.

\* \* \* \* \*